United States Patent
Park et al.

(10) Patent No.: US 11,482,871 B2
(45) Date of Patent: Oct. 25, 2022

(54) ELECTRONIC DEVICE AND CHARGING CONTROL METHOD THEREFOR

(71) Applicant: Samsung Electronics Co., Ltd., Gyeonggi-do (KR)

(72) Inventors: Young-Jin Park, Gyeonggi-do (KR); Sung-Ha Park, Gyeonggi-do (KR); Joon-Yung Park, Gyeonggi-do (KR); Jung-Oh Sung, Gyeonggi-do (KR); Dong-Rak Shin, Gyeonggi-do (KR); Jae-Hyun Ahn, Gyeonggi-do (KR); Sung-Eun Lee, Gyeonggi-do (KR); Wooin Choi, Seoul (KR); Insun Choi, Gyeonggi-do (KR); Jongik Won, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 179 days.

(21) Appl. No.: 16/625,901

(22) PCT Filed: May 15, 2018

(86) PCT No.: PCT/KR2018/005571
§ 371 (c)(1),
(2) Date: Dec. 23, 2019

(87) PCT Pub. No.: WO2018/236054
PCT Pub. Date: Dec. 27, 2018

(65) Prior Publication Data
US 2020/0153256 A1    May 14, 2020

(30) Foreign Application Priority Data

Jun. 23, 2017  (KR) .................. 10-2017-0080016

(51) Int. Cl.
*H02J 7/00* (2006.01)
*G01R 31/52* (2020.01)
*G06F 1/26* (2006.01)

(52) U.S. Cl.
CPC ............ *H02J 7/0031* (2013.01); *G01R 31/52* (2020.01); *G06F 1/266* (2013.01); *H02J 7/0036* (2013.01);
(Continued)

(58) Field of Classification Search
CPC ..................................................... H02J 7/0031
(Continued)

(56) References Cited

U.S. PATENT DOCUMENTS 9,625,988 B1   4/2017  Agarwal et al.
2012/0249075 A1*  10/2012  Hori .................. H02H 7/18
                                                    320/118
(Continued)

FOREIGN PATENT DOCUMENTS

JP    2013-222281 A    10/2013
JP    2015-82956 A    4/2015
(Continued)

OTHER PUBLICATIONS

Korean Search Report dated Nov. 11, 2021.
Notice of Patent Grant dated Aug. 25, 2022.

*Primary Examiner* — Yalkew Fantu
(74) *Attorney, Agent, or Firm* — Cha & Reiter, LLC

(57) ABSTRACT

Various embodiments of the present invention relate to an electronic device and a charging control method therefor. The electronic device may comprise: a connection terminal
(Continued)

for performing wired communication with an external electronic device; and at least one processor functionally connected to the connection terminal, wherein the at least one processor detects connection of a charging device through the connection terminal, receives state information of at least one adjacent terminal located next to a power terminal of the connection terminal, and controls charging power to be supplied thereto through the charging device, on the basis of the received state information of the adjacent terminal. In addition, various other embodiments are possible.

12 Claims, 13 Drawing Sheets

(52) U.S. Cl.
CPC ....... *H02J 7/00308* (2020.01); *H02J 2207/30* (2020.01)

(58) Field of Classification Search
USPC ........................................................ 320/107
See application file for complete search history.

(56) References Cited

U.S. PATENT DOCUMENTS

| | | |
|---|---|---|
| 2013/0057201 A1* | 3/2013 | Wakayama ........... H02J 7/0042 |
| | | 320/107 |
| 2013/0271206 A1 | 10/2013 | Sakai |
| 2015/0123616 A1* | 5/2015 | Oku ...................... H02J 7/0044 |
| | | 320/114 |
| 2016/0172882 A1* | 6/2016 | Hatanaka ................ H02J 50/12 |
| | | 320/108 |
| 2016/0259005 A1 | 9/2016 | Menon et al. |
| 2017/0139467 A1* | 5/2017 | Waters ................ G06F 13/4282 |
| 2017/0271897 A1 | 9/2017 | Wen |

FOREIGN PATENT DOCUMENTS

| | | |
|---|---|---|
| KR | 10-2010-0000347 A | 1/2010 |
| KR | 10-1565587 B1 | 11/2015 |
| KR | 10-2016-0047170 A | 5/2016 |
| WO | 2016/106616 A1 | 7/2016 |

\* cited by examiner

ELECTRONIC DEVICE AND CHARGING CONTROL METHOD THEREFOR

CROSS REFERENCE TO RELATED APPLICATIONS

This application is a National Phase Entry of PCT International Application No. PCT/KR2018/005571, which was filed on May 15, 2018, and claims a priority to Korean Patent Application No. 10-2017-0080016, which was filed on Jun. 23, 2017, the contents of which are incorporated herein by reference.

TECHNICAL FIELD

Various embodiments of the disclosure relate to an electronic device and a charging control method therefor.

BACKGROUND ART

Electronic devices (for example, mobile terminals, smartphones, wearable electronic devices, or the like) may provide various functions. For example, a smartphone may provide short-range wireless communication (for example, Bluetooth, wireless fidelity, near field communication (NFC), or the like), mobile communication ($3^{rd}$ generation (3G), 4G, 5G, or the like), a music or video replay function, a capturing function, a navigation function, a messenger function, etc., in addition to a basic voice communication function.

Electronic devices providing the various functions may use batteries for the sake of portability. The battery may be charged in a wired charging method or a wireless charging method. As the capacity of the battery increases, recent electronic devices support fast charging for charging the battery quickly. For example, recent electronic devices may support fast charging for charging a battery with a voltage (for example, 9, 12, 15, 20 V) higher than a normal charging voltage (for example, 5 voltage (V)).

The electronic devices may be connected with an external device (for example, a charging device, a monitor, a docking device, other electronic devices, or the like). For example, the electronic devices may be connected with an external device through a universal serial bus (USB) interface. Recently, many electronic devices include an interface of the USB type C (Type-C) standard. Since the interface of the USB type-C standard has a symmetric structure and does not have directionality, it may easily connect a USB cable.

DISCLOSURE OF INVENTION

Technical Problem

In the interface of the USB Type-C standard, terminals are arranged close to one another with a gap of 0.25 mm to 0.30 mm therebetween, and thus the terminals (for example, a power terminal and a terminal positioned next to the power terminal (hereinafter, an adjacent terminal)) may be short-circuited due to various factors. For example, the terminals may be short-circuited by foreign substances (for example, water, saliva, sweat, etc.), corrosion of the terminal, or a manufacturing defect.

When a high voltage (for example, 9 V) is applied to the power terminal to perform fast charging in a state in which at least one of the power terminal and the adjacent terminal is short-circuited due to the above-described various factors, the adjacent terminal of the electronic device and/or at least one component (for example, a diode, a resistor, an IC, etc.) electrically connected to the adjacent terminal and having a withstanding voltage less than the high voltage may be damaged To solve the above-described problems, various embodiments of the disclosure provide an electronic device which controls a charging power by considering states of terminals of an interface when a fast charging device is connected, and a charging control method therefor.

Solution to Problem

According to various embodiments of the disclosure, an electronic devices includes: a connection terminal configured to wiredly communicate with an external electronic device; and at least one processor functionally connected with the connection terminal, and the at least one processor may be configured to: detect a connection of a charging device through the connection terminal; receive state information of at least one adjacent terminal positioned next to a power terminal of the connection terminal; and control a charging power to be supplied thereto through the charging device, based on the received state information of the adjacent terminal.

According to various embodiments of the disclosure, a charging control method of an electronic device includes: detecting a connection of a charging device to a connection terminal which wiredly communicates with an external electronic device; identifying a state of at least one adjacent terminal positioned next to a power terminal of the connection terminal; and controlling a charging power of the charging device, based on the state of the adjacent terminals.

According to various embodiments of the disclosure, a computer-readable recording medium may store at least one instructions that, when being executed by at least one processor, cause the at least one processor to detect a connection of a charging device to a connection terminal which wiredly communicates with an external electronic device; to identify a state of at least one adjacent terminal positioned next to a power terminal of the connection terminal; and to control a charging power of the charging device, based on the state of the adjacent terminals.

Advantageous Effects of Invention

Various embodiments of the disclosure can prevent a damage to an adjacent terminal and/or a component electrically connected to the adjacent terminal by controlling charging power according to whether terminals of an interface are short-circuited. For example, when a power terminal and an adjacent terminal of an interface are short-circuited, the electronic device may control to charge by restricting a voltage supplied to the power terminal to a designated value or less, or to stop charging. Various embodiments of the disclosure can enhance durability of the electronic device by preventing a damage to the adjacent terminal and/or the component, and can enhance user's reliability.

BEST MODE FOR CARRYING OUT THE INVENTION

Figure 1:
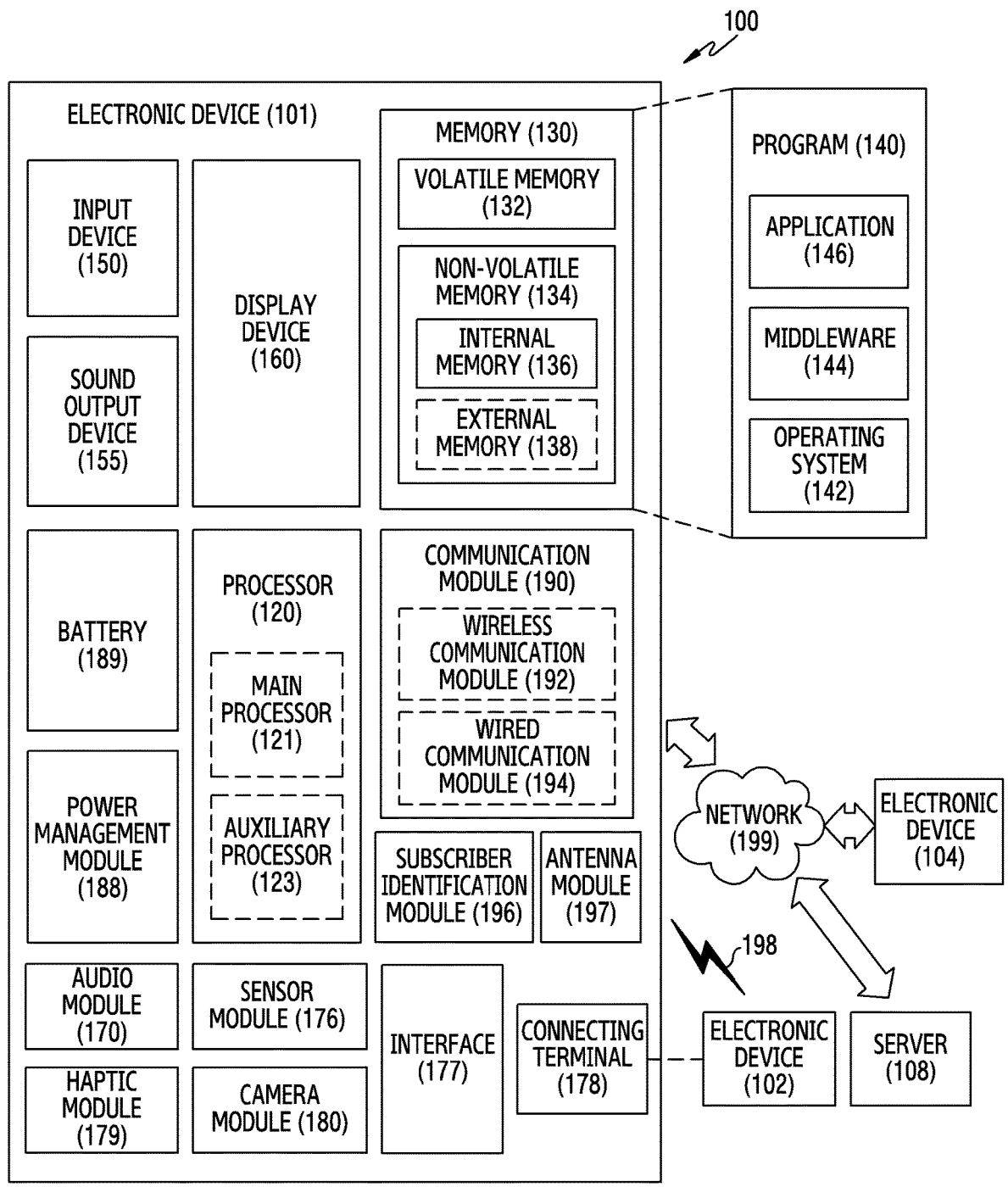
FIG. 1 is a block diagram of an electronic device in a network environment according to various embodiments of the disclosure.

Hereinafter, various embodiments of the disclosure will be described with reference to the accompanying drawings. In the disclosure, specific embodiments are illustrated in the drawings and relevant detailed descriptions are provided, but this is not intended to limit various embodiments of the disclosure to specific forms. For example, it is obvious to those skilled in the art to which the disclosure belongs that embodiments of the disclosure can be variously changed.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication), or an electronic device 104 or a server 108 via a second network 199 (e.g., a long-range wireless communication). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, and an antenna module 197. In some embodiments, at least one (e.g., the display device 160 or the camera module 180) of the components may be omitted from the electronic device 101, or other components may be added in the electronic device 101. In some embodiments, some of the components, for example, may be integrated and implemented such as the sensor module 176 (e.g., a fingerprint sensor, an iris sensor, or an illuminance sensor) embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing and computation. The processor 120 may load and process a command or data received from another component (e.g., the sensor module 176 or the communication module 190) in volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from the main processor 121, may additionally or alternatively consume less power than the main processor 121, or to be specific to a specified function. The auxiliary processor 123 may be implemented as separate from, or embedded in the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., performing an application). According to an embodiment, the auxiliary processor 123 (e.g., an image signal processor or a communication processor) may be implemented as part of another component (e.g., the camera module 180 or the communication module 190) functionally related to the auxiliary processor 123. The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to a user of the electronic device 101. The display device 160 may include, for example, a display, a hologram device, or a projector and control circuitry to control a corresponding one of the display, hologram device, and projector. According to an embodiment, the display device 160 may include touch circuitry, or a pressure sensor adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) wiredly or wirelessly coupled with the electronic device 101.

The sensor module 176 may generate an electrical signal or data value corresponding to an operational state (e.g., power or temperature) of the electronic device 101 or an environmental state external to the electronic device 101. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support a specified protocol for coupling with the external electronic device (e.g., the electronic device 102) wiredly or wirelessly. According to an embodiment, the interface 177 may include a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). The connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. According to an embodiment, the camera module 180 may include one or more lense, image sensor, image signal processor, or flash.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a wired communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a wired communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single chip, or may be implemented as multi chips separate from each other.

The wireless communication module 192 may identify and authenticate the electronic device 101 in a communication network using subscriber information stored in the subscriber identification module 196.

The antenna module 197 may include one or more antennas to transmit or receive a signal or power to or from the outside. According to an embodiment, the communication module 190 (e.g., the wireless communication module 192) may transmit or receive the signal to or from the external electronic device through an antenna appropriate for a communication scheme.

Some of the above-described components may be coupled mutually and communicate signals (e.g., commands or data) therebetween via an inter-peripheral communication scheme (e.g., a bus, general purpose input/output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices. According to an embodiment, if the electronic device 101 should perform a function or a service automatically, or by a request, the electronic device 101, instead of, or in addition to, executing the function or the service, may request at least part associated with the function or the service to external electronic devices. The external electronic devices receiving the request may perform the function requested, or an additional function, and transfer an outcome of the performing to the electronic device 101. The electronic device 101 may provide the outcome, with or without further processing of the outcome. To that end, a cloud computing, distributed computing, or client-server computing technology may be used, for example.

Figure 2:
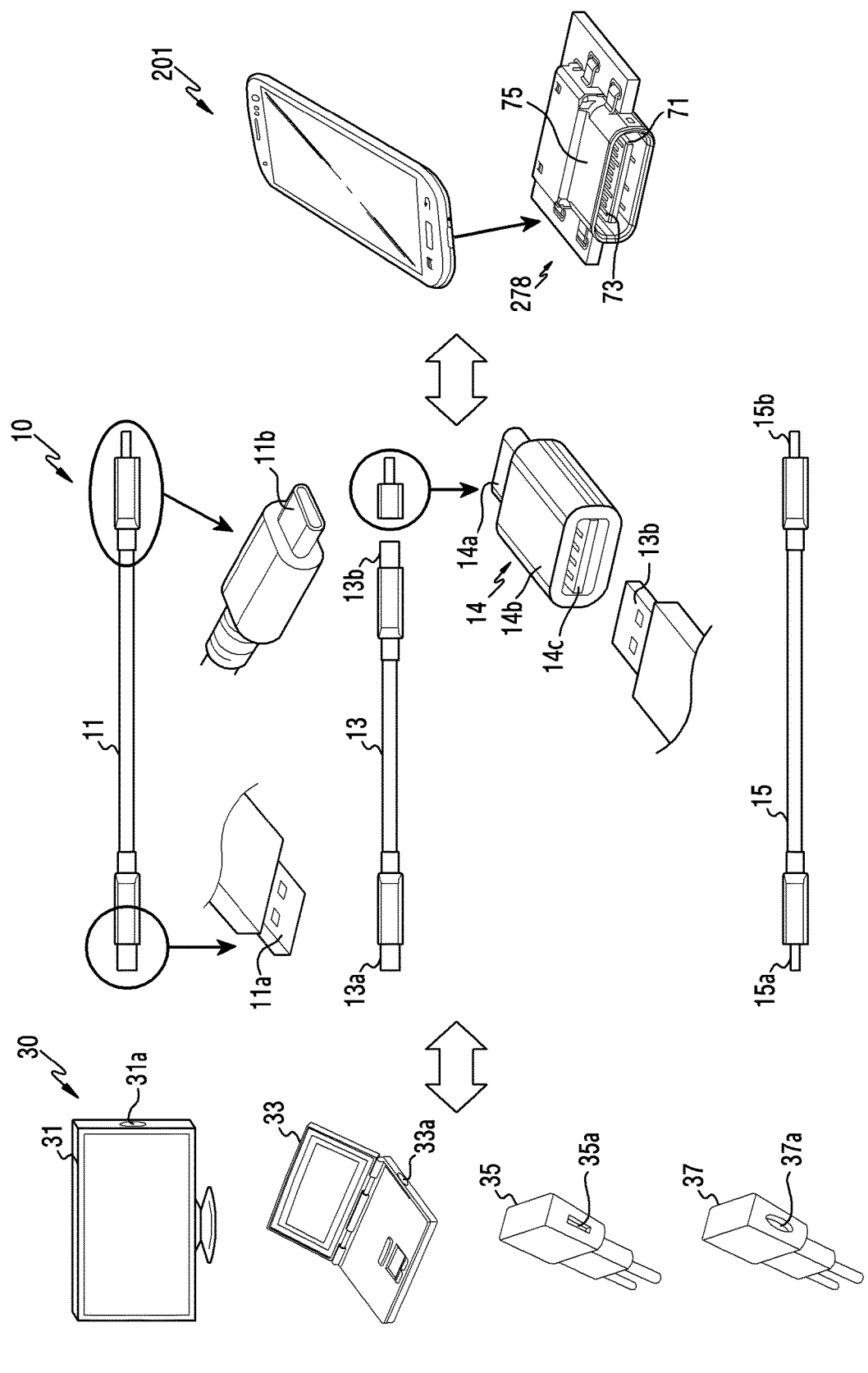
FIG. 2 is a view illustrating a method for charging an electronic device according to various embodiments of the disclosure.

FIG. 2 is a view illustrating a method for charging an electronic device according to various embodiments of the disclosure.

Referring to FIG. 2, an electronic device 201 may be connected with one of various external devices 30 through one of various cables 10.

The external device 30 according to an embodiment of the disclosure may be a power supply device which supplies power for charging a battery (not shown) embedded in the electronic device 201 or a removable battery (not shown). For example, the external device 30 may be a monitor 31 which includes a connector 31a of the USB Type-C standard, a notebook 33 which has a connector 33a of the USB Type-C standard, a charging device 35 which has a connector 35a of a lower level standard (for example, USB Type-B) of the USB Type-C (hereinafter, a first charging device), or a charging device 37 which has a connector 37a of the USB Type-C standard (hereinafter, a second charging device). The connectors 31a, 33a, 35a, 37a may be in the form of a socket or a receptacle. Hereinafter, the connector in the form of a socket will be described for convenience of explanation.

According to a certain embodiment, the connectors 31a, 33a, 35a, 37a of the external devices 30 may be in the form of a plug. According to a certain embodiment, the first charging device 35 and the second charging device 37 may be integrally formed with the cable 10 and may not include the sockets 35a, 37a.

The external device 30 according to an embodiment of the disclosure may provide normal charging or fast charging. For example, the first charging device 35 may provide fast charging of an adaptive fast charging (AFC) or quick charge (QC) method. The monitor 31 and the notebook 33 may provide fast charging of a power delivery (PD) charging method through the socket of the USB Type-C standard positioned on one side thereof. The second charging device 37 may provide fast charging of an AFC, QC, or PD charging method.

The socket 31a, 33a, 35a, 37a of the external device 30 may be damaged (for example, at least some terminals are short-circuited) due to various factors such as foreign substances (for example, water, saliva, sweat, etc.), corrosion of a terminal, or a manufacturing defect.

The cable 10 according to an embodiment of the disclosure may connect the external device 30 and the electronic device 201. The cable 10 may have various shapes according to types of connectors positioned at both sides in the form of a plug (hereinafter, a plug). For example, a first cable 11 may have a plug 11a of the USB Type-B standard disposed at one side, and a plug 11b of the USB Type-C standard disposed at the other side. The first cable 11 may connect the first charging device 35 and the electronic device 201.

A second cable 13 may have plugs 13a, 13b of the USB Type-B standard disposed at both sides. One (for example, 13b) of the plugs 13a, 13b may be connected with a gender 14. The gender 14 may include a plug 14a of the USB Type-C standard, a housing 14b, and a socket 14c connected with the plug 13b. The housing 14b may include a circuit (not shown) for connecting and/or interconverting the socket 14c of the USB Type-B standard and the plug 14a of the USB Type-C standard, which have different numbers of terminals. For example, the housing 14b may include a pull-up resistor (not shown) (for example, Rp in FIGS. 5A to 5D) connecting a power terminal and a channel configuration (CC) terminal. The pull-up resistor may have a value of 10 kiloohms, 22 kiloohms, or 56 kiloohms according to the USB Type-C standard. The second cable 13 may be coupled with the gender 14 to connect the first charging device 35 and the electronic device 201. Since the first cable 11 and the second cable 13 do not include CC terminals according to the USB Type-C standard at both sides, the first cable 11 and the second cable 13 may support fast charging of the AFC and QC methods, but may not support fast charging of the PD charging method.

A third cable 15 may have plugs 15a, 15b of the USB Type-C standard disposed at both sides. The third cable 15 may connect the second charging device 35, the monitor 31, or the notebook 33, and the electronic device 201, and may support fast charging of the PD charging method.

The plugs 11a, 11b, 13a, 13b, 15a, 15b of the first cable 11 to the third cable 15, and the plug 14a and the socket 14b of the gender 14 may be damaged (for example, at least some terminals are short-circuited) due to the above-described various factors.

The electronic device 201 according to an embodiment of the disclosure may include an entirety or a part of the electronic device 101 shown in FIG. 1. The electronic device 201 may include a socket 278 (for example, the connection terminal 178 of FIG. 1) of the USB Type-C standard.

The socket 278 may include a housing 75, a plurality of terminals 73 (for example, 24 metal pins according to the USB Type-C standard), and a support member 71 supporting the plurality of terminals 73. Although FIG. 2 depicts that the socket 278 is positioned on a lower end of the electronic device 201, this is merely an example, and the socket 278 may be positioned on an upper end or a side surface of the electronic device 201. According to a certain embodiment, the electronic device 201 may include a plurality of sockets.

The electronic device 201 according to an embodiment of the disclosure may control charging by considering a state of at least one terminal positioned in the socket 278. For example, the electronic device 201 may determine whether a power terminal (VBUS) for supplying power for charging a battery and at least one other terminal (for example, a CC terminal, a SBU terminal, a data terminal (TX1-terminal, RX1-terminal, TX2-terminal, RX2-terminal)) are short-circuited, and, when the power terminal (VBUS) and at least one other terminal (hereinafter, an adjacent terminal) are electrically short-circuited, the electronic device 201 may not perform fast charging of a high voltage (for example, 9 V) and may restrict charging to charge at a predetermined value (for example, 5 V) or less. Alternatively, the electronic device 201 may stop charging. The power terminal (VBUS) and at least one adjacent terminal may be short-circuited due to various factors such as foreign substances (for example, water, saliva, sweat, etc.), corrosion of a terminal, or a manufacturing defect. Alternatively, the short-circuit may be caused by a non-genuine gender (for example, a poor gender) which removes a resistor between a power terminal and a CC terminal to save a manufacturing cost, and is directly connected.

By restricting charging power (for example, a voltage) or stopping charging when the power terminal (VBUS) and the at least one adjacent terminal are short-circuited, various embodiments of the disclosure can prevent a damage to the at least one adjacent terminal and/or at least one component electrically connected with the adjacent terminal. For example, various embodiments of the disclosure can prevent adjacent terminals from being combusted by continuous supply of a high voltage, or can prevent a damage to a transient voltage suppression (TVS) diode, an integrated circuit (IC), etc. for protecting an element from a momentary overvoltage.

Figure 3:
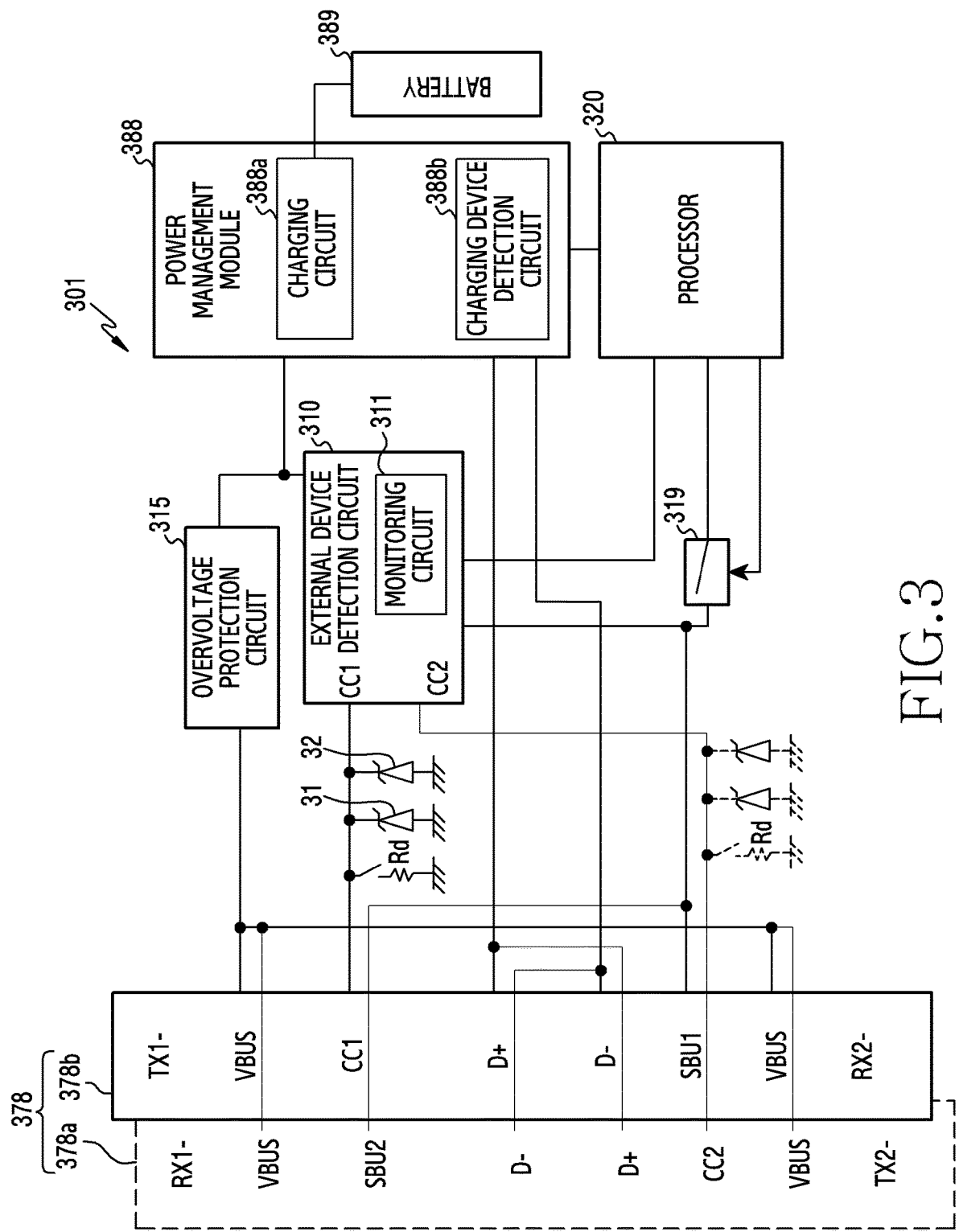
FIG. 3 is a block diagram illustrating a configuration of an electronic device according to an embodiment of the disclosure.
Figure 4:
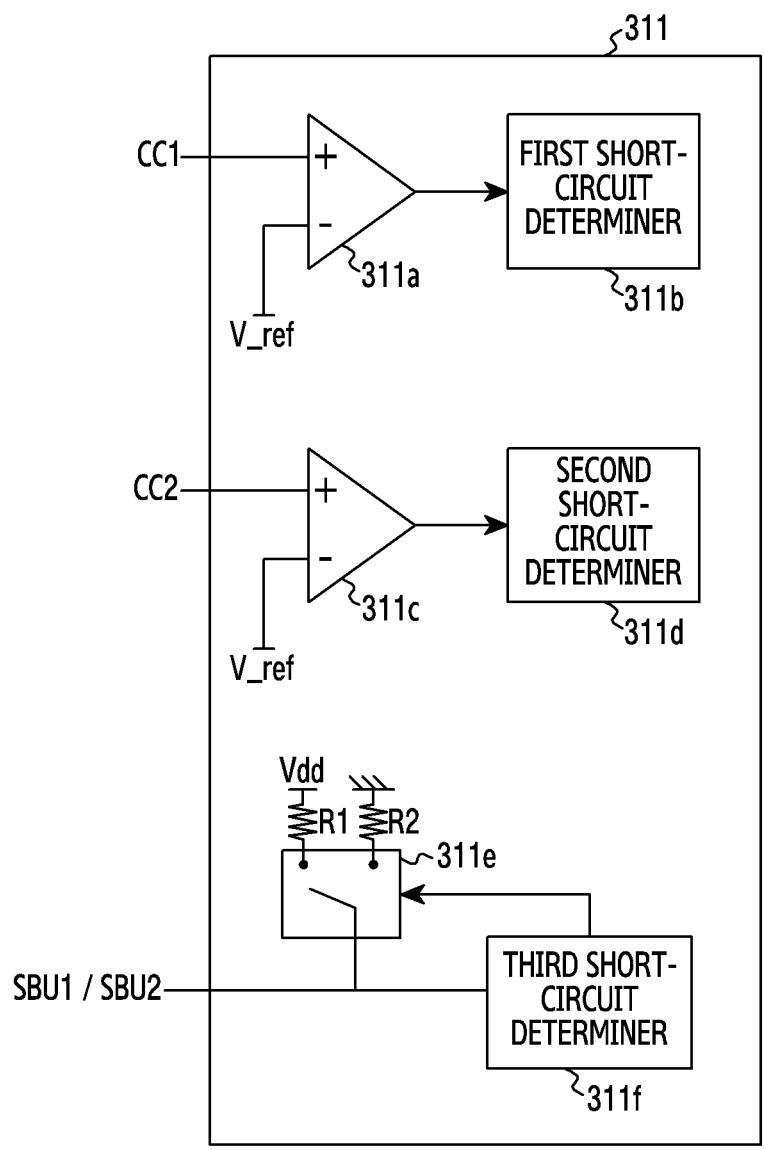
FIG. 4 is a view illustrating a monitoring circuit of FIG. 3 in detail.

FIG. 3 is a block diagram illustrating a configuration of an electronic device according to an embodiment of the disclosure, FIG. 4 is a view illustrating a monitoring circuit of FIG. 3 in detail, and FIGS. 5A to 5D are views illustrating power supply paths of the electronic device according to an embodiment of the 10 disclosure.

Referring to FIGS. 3 to 5D, the electronic device 301 according to an embodiment of the disclosure may include, for example, an entirety or a part of the electronic device 101 shown in FIG. 1 or the electronic device 201 shown in FIG. 2.

The electronic device 301 according to an embodiment of the disclosure may include an external device detection circuit 310 an overvoltage protection circuit 315, a switch 319, a processor 320, a connection terminal 378, a power management module 388, and a battery 389.

The connection terminal 378 (for example, the connection terminal 178 of FIG. 1, the connection terminal 278 of FIG.

2) may be a physical connector to which an external device or a cable is connected. The connection terminal 378 may conform to the USB Type-C standard. The connection terminal 378 may include a first connection portion 378a and a second connection portion 378b which have a symmetric structure.

The first connection portion 378a may include a negative transmission terminal TX1−, a power terminal VBUS, a configuration channel terminal CC1, a positive data terminal D+, a negative data terminal D−, a reservation terminal SBU1, a power terminal VBUS, a negative reception terminal RX2−. The first connection portion 378a may further include terminals conforming to the USB Type-C standard although they are not illustrated in FIG. 3. For example, the first connection portion 378a may further include a first ground terminal GND, a positive transmission terminal TX1+, a positive reception terminal RX2+, and a second ground terminal GND.

The second connection portion 378b is symmetric to the first connection portion 378a, and is the same as the first connection portion 378a, and thus a detailed description thereof is omitted.

The external device detection circuit 310 may be connected to the connection terminal 378 (for example, the configuration channel terminal CC1 and/or the reservation terminal SBU1), and may detect a connection of an external device (for example, the external device 30 of FIG. 2). The external device detection circuit 310 may be a power delivery integrated circuit (PDIC) or a channel configuration integrated circuit (CCIC).

The external device detection circuit 310 may include a monitoring circuit 311 to monitor CC terminals CC1, CC2, and/or reservation terminals SBU1, SBU2.

The monitoring circuit 311 may detect a connection of an external device (for example, a fast charging device) through the CC terminals CC1, CC2. The detection method conforms to the USB Type-C standard and a detailed description thereof is omitted. The monitoring circuit 311 may identify a state (for example, a short-circuit) of at least one adjacent terminal (for example, CC terminals CC1, CC2, reservation terminals SBU1, SBU2) when the connection of the external device is detected, and may transmit a result of monitoring to the processor 320. Referring to FIG. 4, the monitoring circuit 311 may include a first comparator 311a, a first short-circuit determiner 311b, a second comparator 311c, a second short-circuit determiner 311d, a switch 311e, and a third short-circuit determiner 311f.

The first comparator 311a may compare a voltage inputted through a first CC terminal CC1 and a reference voltage V_ref, and may detect whether the first CC terminal CC1 is short-circuited. For example, when the voltage of the first CC terminal CC1 is greater than or equal to the reference voltage V_ref, the first comparator 311a may be configured to output a high signal of a designated value (for example, 3 V). When the voltage of the first CC terminal CC1 is lower than the reference voltage V_ref, the first comparator 311a may be configured to output a low signal.

Figure 5A:
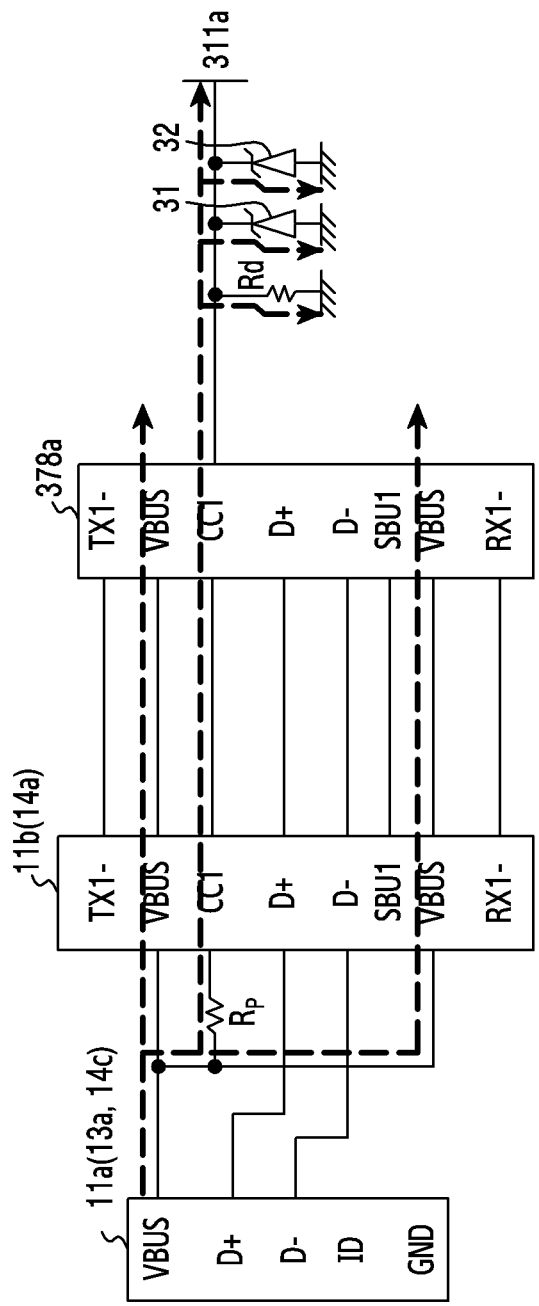
FIG. 5A is a view illustrating a power supply path of an electronic device when a first charging device is connected according to an embodiment of the disclosure.

Referring to FIGS. 5A to 5D, when a first charging device (for example, the first charging device 35 of FIG. 2) of an AFC or QC charging method is connected to the electronic device 301 through a cable, the first charging device may apply power of a set voltage (for example, 5 V) to the power terminals VBUS and the first CC terminal CC1 of the electronic device 301 through a power terminal VBUS of the cable, as shown in FIG. 5A. The power applied to the first CC terminal CC1 may be distributed by a pull-up resistor Rp positioned in the cable 11 (or gender 14), and a pull-down resistor Rd positioned in the electronic device 301, and may be inputted to TVS diodes 31, 32 and a non-inverting terminal (+) of the first comparator 311a. For example, when the set voltage is 5 V, the pull-up resistor Rp is 56 kiloohms, and the pull-down resistor Rd is 5.1 kiloohms, the voltage inputted to the TVS diodes 31, 32 and the non-inverting terminal (+) of the first comparator 311a may be about 0.4 V (=5*5.1/61.1). Alternatively, when the set voltage is 5 V, the pull-up resistor Rp is 22 kiloohms, and the pull-down resistor Rd is 5.1 kiloohms, the voltage inputted to the TVS diodes 31, 32 and the non-inverting terminal (+) of the first comparator 311a may be about 0.9 V(=5*5.1/27.1). Alternatively, when the set voltage is 5 V, the pull-up resistor Rp is 10 kiloohms, and the pull-down resistor Rd is 5.1 kiloohms, the voltage inputted to the TVS diodes 31, 32 and the non-inverting terminal (+) of the first comparator 311a may be about 1.7 V(=5*5.1/15.1). The voltage inputted to the TVS diodes 31, 32 may be less than or equal to a withstanding voltage (about 6.2 V to 7.4 V) of the TVS diodes 31, 32.

The reference voltage V_ref may be greater than a maximum voltage (for example, 1.7 V) applied to the first CC terminal CC1 when a cable is connected, and may have a value smaller than a voltage (for example, 5 V) of the power terminal VBUS. For example, the reference voltage V_ref may be 2.7 V.

Since the reference voltage V_ref is greater than the voltage of the first CC terminal CC1 when the first charging device is connected, the first comparator 311a may output a low signal (for example, 0 V).

Figure 5B:
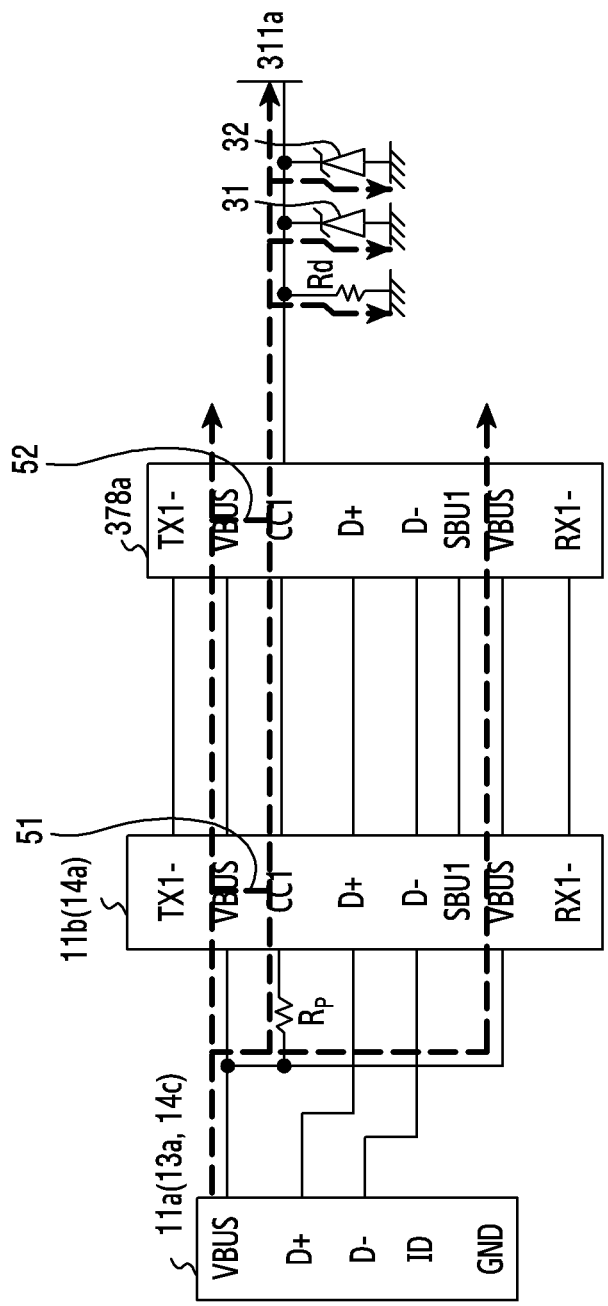
FIG. 5B is a view illustrating the power supply path of the electronic device when the first charging device is connected according to an embodiment of the disclosure.

On the other hand, when the power terminal VBUS and the first CC terminal CC1 are short-circuited due to the above-described various factors, power of the first charging device may be directly applied to the first CC terminal CC1. For example, as shown in FIG. 5B, when the power terminal VBUS and the first CC terminal CC1 are short-circuited in at least one of the cable 11 (or the gender 14) and the connection terminal 378a of the electronic device 301, power of the first charging device may be directly applied to the first CC terminal CC1 through at least one of a first path 51 which may be generated in the cable 11 (or gender 14) or a second path 52 which may be generated in the connection terminal 378a of the electronic device 301. In other words, the power (for example, 5 V) of the first charging device may be directly applied to the TVS diodes 31, 32 and the non-inverting terminal (+) of the first comparator 311a. In this case, the first comparator 311a may output a high signal since the voltage applied to the non-inverting terminal (+) of the first comparator 311a is greater than the reference voltage V_ref. When the power of the first charging device increases (for example, to 9 V) for the purpose of fast charging in the short-circuit state according to a related-art method, a voltage greater than a withstanding voltage of the TVS diodes 31, 32 may be applied to the TVS diodes 31, 32, and the TVS diodes 31, 32 may be damaged.

Figure 5C:
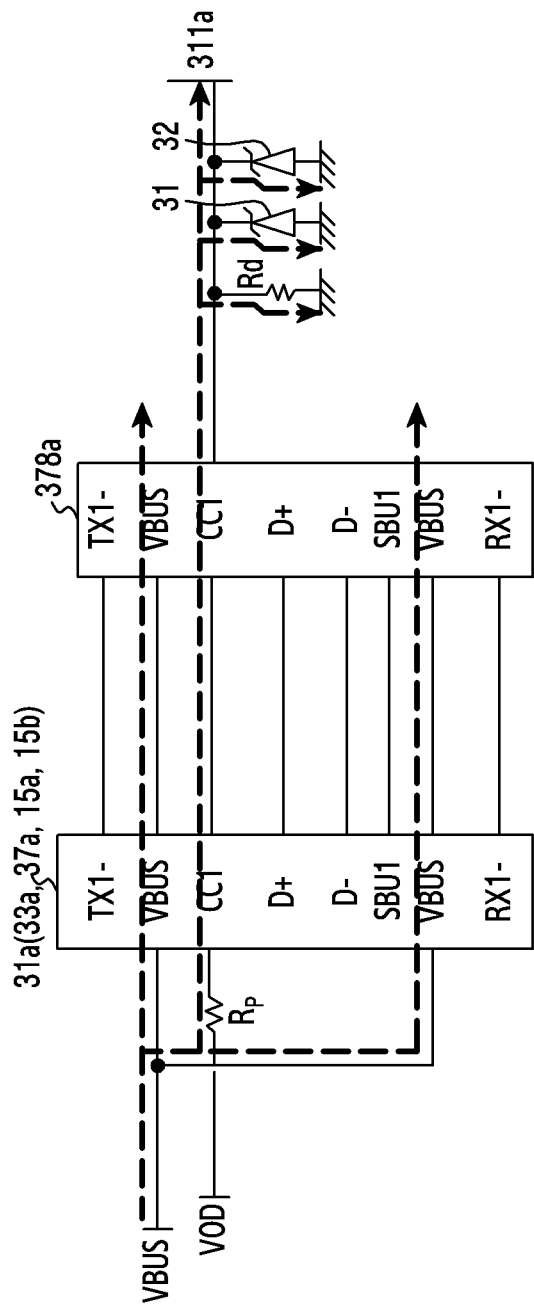
FIG. 5C is a view illustrating a power supply path of the electronic device when a second charging device is connected according to an embodiment of the disclosure.

According to a certain embodiment, when a second charging device of a PD charging method (for example, the monitor 31, the notebook 33, the second charging device 37 of FIG. 2) is connected to the electronic device 301 through a cable (for example, the third cable 15), the second charging device may supply first power (for example, 5 V) to the power terminals VBUS of the electronic device 301 through the cable, and may apply second power (for example, 5 V or 3.3 V) conforming to the USB Type-C standard to the first CC terminal CC1 of the electronic device 301, as shown in FIG. 5C. The second power may be distributed by a pull-up resistor Rp positioned in the second charging device, and the pull-down resistor Rd positioned in the electronic device 301, and may be inputted to the TVS diodes 31, 32, and the first comparator 311a. Herein, the first comparator 311a may output a low signal since the reference voltage V_ref is greater than the voltage of the first CC terminal CC1 when the second charging device is connected.

Figure 5D:
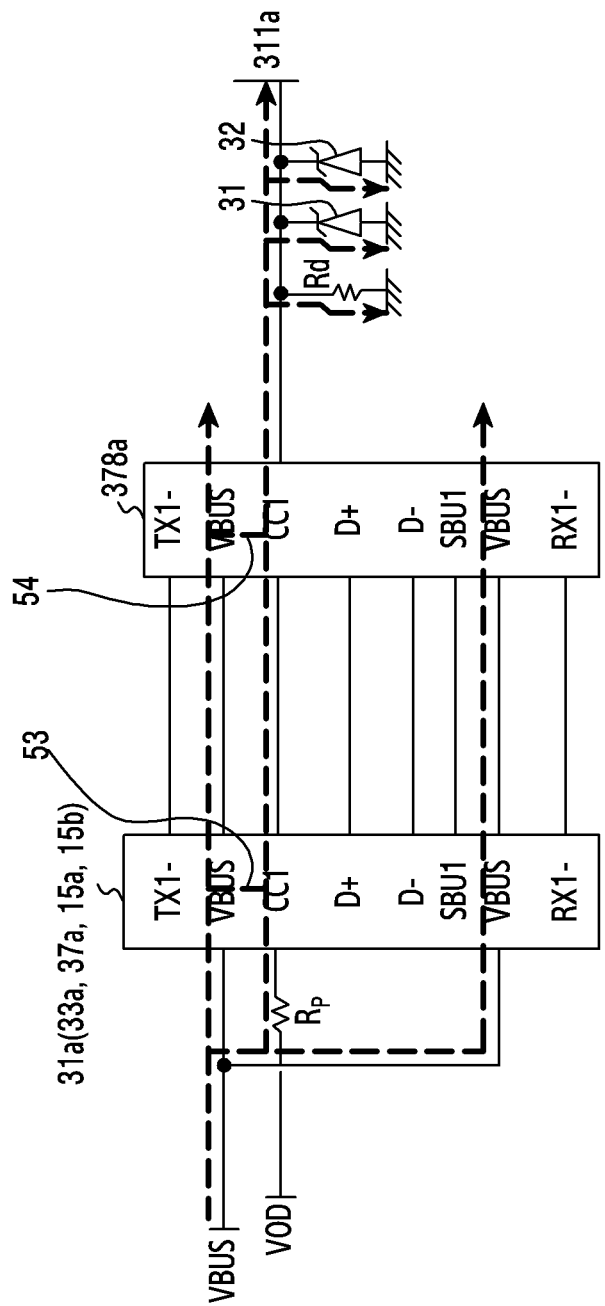
FIG. 5D is a view illustrating the power supply path of the electronic device when the second charging device is connected according to an embodiment of the disclosure.

On the other hand, when the power terminal VBUS and the first CC terminal CC1 are short-circuited due to the above-described various factors, the first power of the second charging device may be directly applied to the first CC terminal CC1. For example, as shown in FIG. 5D, when the power terminal VBUS and the first CC terminal CC1 are short-circuited in at least one of a socket of the second charging device (for example, the sockets 31a, 33a, 37a of FIG. 2), the plugs 15a, 15b of the third cable 15, or the connection terminal 378a of the electronic device 301, the first power of the second charging device may be directly applied to the first CC terminal CC1 of the electronic device 301 through at least one of a first path 53 which may be generated in the socket of the second charging device (for example, the sockets 31a, 33a, 37a of FIG. 2) or the plugs 15a, 15b of the third cable 15, or a second path 54 which may be generated in the connection terminal 378a of the electronic device 301. The first comparator 311a may output a high signal since the voltage applied to the non-inverting terminal (+) of the first comparator 311a is greater than the reference voltage V_Ref. When the power of the second charging device increases (for example, to 9 V, 12 V, 20 V) for the purpose of fast charging in the short-circuit state according to a related-art method, a voltage greater than the withstanding voltage of the TVS diodes 31, 32 may be applied to the TVS diodes 31, 32, and the TVS diodes 31, 32 may be damaged.

When the low signal is inputted from the first comparator 311a, the first short-circuit determiner 311b may determine that the first CC terminal CC is not short-circuited and is in a normal state. On the other hand, when the high signal is inputted from the first comparator 331a, the first short-circuit determiner 311b may determine that the first CC terminal CC1 is short-circuited and is in an abnormal state.

The second comparator 311c and the second short-circuit determiner 311d are configured to determine whether a second CC terminal CC2 is short-circuited, and are similar to the first comparator 311a and the first short-circuit determiner 311b and thus a detailed description thereof is omitted.

The switch 311e may be switched such that the reservation terminal SBU1, SBU2 is connected with a pull-up resistor or a pull-down resistor when an external device is connected.

When a connection of an external device (for example, a fast charging device) is detected, the third short-circuit determiner 311f may control the switch 311e such that the reservation terminal SBU1, SBU2 and a pull-up resistor R1 are connected with each other, and may identify a state (for example, a voltage) of the reservation terminal SBU1, SBU2, and then may control the switch 311e such that the reservation terminal SBU1, SBU2 and a pull-down resistor R2 are connected with each other, and may identify a state (for example, a voltage) of the reservation terminal SBU1, SBU2. When a high signal and a low signal are alternately inputted, the third short-circuit determiner 311f may determine that the reservation terminal SBU1, SBU2 is not short-circuited and is in the normal state. On the other hand, when a high signal is continuously inputted although switching is performed, the third short-circuit determiner 311f may determine that the reservation terminal SBU1, SBU2 is short-circuited and is in the abnormal state.

According to a certain embodiment, the third short-circuit determiner 311f may determine a short-circuit through a voltage level of the reservation terminal SBU1, SBU2. To achieve this, the electronic device 301 may further include an analog-digital converter (ADC) (not shown) between the third short-circuit determiner 311f and the reservation terminal SBU1, SBU2. The third short-circuit terminal 311f may identify a voltage level which is converted through the ADC when an external device is connected, and, when the identified voltage level is the same as or similar to a voltage (for example, 5 V) of the power terminal VBUS, the third short-circuit determiner 311f may determine that the reservation terminal SBU1, SBU2 is short-circuited. This is because the reservation terminals SBU1, SBU2 normally communicate data with a voltage (for example, 1.8 V) lower than the voltage (for example, 5 V) of the power terminal VBUS.

The electronic device 301 may further include a configuration for determining whether the data terminals TX1−, RX1−, TX2−, RX2− are short-circuited although it is not illustrated in FIGS. 3 and 4. It may be determined whether the data terminals TX1−, RX1−, TX2−, RX2− are short-circuited in a similar method to the method for determining whether the reservation terminal SBU1, SBU2 is short-circuited.

Although a configuration using the comparators 311a, 311c and the switch 311e is exemplified in FIG. 4 as an implementation method for determining the short-circuit of the CC terminals CC1, CC2 and the reservation terminal SBU1, SBU2, various embodiments of the disclosure are not limited thereto and other various implementations are possible.

The overvoltage protection circuit 315 may be connected with the power terminal VBUS of the connection terminal 378 to prevent an overvoltage from being applied to the power management module 388 and the external device detection circuit 310.

The switch 319 may connect or block a path between the reservation terminal SBU1, SBU2 and the processor 320. The switch 319 according to an embodiment of the disclosure may be switched to block the path when it is determined whether the reservation terminal SBU1, SBU2 is short-circuited. When determination of the short-circuit is completed, the switch 319 may be switched to connect the path. The switch 319 may be controlled to be switched by the processor 320. According to a certain embodiment, the switch 319 may be controlled to be switched by the external device detection circuit 310. According to various embodiments of the disclosure, the switch 319 may be omitted.

The processor 320 may control overall operations of the electronic device 301. For example, the processor 320 may control respective components of the electronic device 301. The processor 320 may receive a command or instructions from a memory (not shown), and may control respective components according to the received command or instructions to perform various functions.

The processor 320 may be formed with a central processing unit (CPU), an application processor (AP), a microcontrol unit (MCU), a micro processor unit (MPU), or the like. The processor 320 may be formed with a single core processor or a multi-core processor. In another embodiment, the processor 320 may be a multi-processor including a plurality of processors. For example, the processor 320 may include an application processor (AP) and a communication processor (CP). In another embodiment, the processor 320 may include a high-power processor (for example, an AP) and a low-power processor (for example, an MCU, an MPU).

The processor 320 may control the external device detection circuit 310 and a charging device detection circuit 388*b*. For example, the processor 320 may drive an external device detection circuit driver (software) (not shown), and a charging device detection circuit driver (software) (not shown). When an AFC or QC charging device is connected, the processor 320 according to an embodiment of the disclosure may receive attach information of a cable and/or state information of an adjacent terminal from the external device detection circuit 310 through the first CC terminal CC1 and the second CC terminal, and may control charging power according to the received attach information and/or the state information of the adjacent terminal. For example, the processor 320 may control the charging power through the charging device detection circuit 388*b*. A detailed description of this will be provided with reference to FIG. 6.

According to a certain embodiment, when a PD charging device is connected, the processor 320 may receive state information of at least one adjacent terminal and a charging level list from the external device detection circuit 310. The processor 320 may select one of charging power included in the charging level list by considering the state of the at least one adjacent terminal, and may transmit the selected charging power to the external device detection circuit 310. A detailed description of this will be provided with reference to FIG. 7.

The power management module 388 may receive power from the battery 389 or an external device, and may supply power to respective components of the electronic device 301. The power management module 388 according to an embodiment of the disclosure may include a charging circuit 388*a* to control charging of the battery 389, and the charging device detection circuit 388*b* to detect and control an external charging device.

The charging circuit 388*a* may charge the battery 389 by using power inputted through the power terminal VBUS of the connection terminal 378. The charging circuit 388*a* may support fast charging.

The charging device detection circuit 388*b* and/or the processor 320 (for example, the charging device detection circuit driver) may detect a connection of an external charging device. The charging device detection circuit 388*b* and/or the processor 320 may identify a type of the connected external charging device. For example, the charging device detection circuit 388*b* and/or the processor 320 may identify whether the external device is an AFC or QC charging device supporting fast charging. The charging device detection circuit 388*b* according to an embodiment of the disclosure may receive state information of at least one adjacent terminal from the processor 320, and may control charging based on the received state information. For example, when the at least one adjacent terminal is in an abnormal state (for example, a short-circuit), the charging device detection circuit 388*b* may restrict charging not to perform fast charging through the external device, or may control the external charging device to stop charging.

The processor 320 according to an embodiment of the disclosure may receive state information of at least one adjacent terminal from the external device detection circuit 310, and may control charging by controlling the charging device detection circuit 388*b* based on the received state information. For example, when at least one adjacent terminal is in an abnormal state (for example, a short-circuit), the processor 320 may control the charging device detection circuit 388*b* to restrict charging not to perform fast charging through the external charging device, or to stop charging.

According to a certain embodiment, the charging circuit 388*a* and the charging device detection circuit 388*b* may not be included in the power management module 388, and may be included in the electronic device 301 as separate components or may be included in other components (for example, the processor 320).

The battery 389 may supply power. The battery 389 may be a battery such as a rechargeable battery and/or a solar cell. Alternatively, the battery 389 may be embedded in the electronic device 301 or may be a removable battery.

Some of the components described above may not be included in the electronic device 301 although not shown in FIG. 3. In another embodiment, the electronic device 301 may further include at least one other component (for example, a digital broadcasting module, a fingerprint recognition module, an input device, a memory, etc.) having an equivalent level to the above-described components.

An electronic device (for example, the electronic device 101, the electronic device 201, the electronic device 301) according to various embodiments of the disclosure may include: a connection terminal (for example, the connection terminal 178, the connection terminal 278, the connection terminal 378) configured to wiredly communicate with an external electronic device; and at least one processor (for example, the processor 120, the processor 320) functionally connected with the connection terminal, and the at least one processor may be configured to: detect a connection of a charging device through the connection terminal; receive state information of at least one adjacent terminal positioned next to a power terminal of the connection terminal; and control a charging power to be supplied thereto through the charging device, based on the received state information of the adjacent terminal.

According to various embodiments, the state information of the at least one adjacent terminal may indicate whether the at least one adjacent terminal is short-circuited with the power terminal.

According to various embodiments, when the charging device supports fast charging of charging a battery with a voltage exceeding a designated voltage, the at least one processor may be configured to identify the state information of the at least one adjacent terminal.

According to various embodiments, in response to the short-circuit being detected, the at least one processor may be configured to control the charging power by maintaining a charging voltage of the charging device at the designated voltage or lower, by stopping charging through the charging device, or by transmitting a reset command to the charging device periodically.

According to various embodiments, the at least one processor may be configured to notify a user that the charging power is restricted or stopped due to a short-circuit of at least one of the adjacent terminals.

According to various embodiments, the at least one processor may be configured to: when the short-circuit is detected, notify the user of disconnection of the charging device; after the charging device is disconnected, identify whether the at least one adjacent terminal is short-circuited again; and, when a short-circuit is detected again as a result of identifying again, determine that the short-circuit occurs in the connection terminal of the electronic device, and to notify the user of occurrence of the short-circuit in the connection terminal.

According to various embodiments, the at least one processor may be configured to, when the short-circuit is not detected again, determine that the short-circuit occurs in at least one of the charging device, a cable, or a gender, and to notify the user of occurrence of the short-circuit in at least one of the charging device, the cable, or the gender.

According to various embodiments, the connection terminal may have a USB Type-C standard, and the at least one adjacent terminal may include at least one of a channel configuration terminal, a reservation terminal, a negative transmission terminal, or a negative reception terminal.

According to various embodiments, the at least one processor may be configured to determine whether the channel configuration terminal of the connection terminal is short-circuited by comparing a voltage of the channel configuration terminal and a reference voltage.

According to various embodiments, the at least one processor may apply a high signal and a low signal to the reservation terminal of the connection terminal alternately, and determine whether the reservation terminal is short-circuited by checking an output signal of the reservation terminal.

Figure 6:
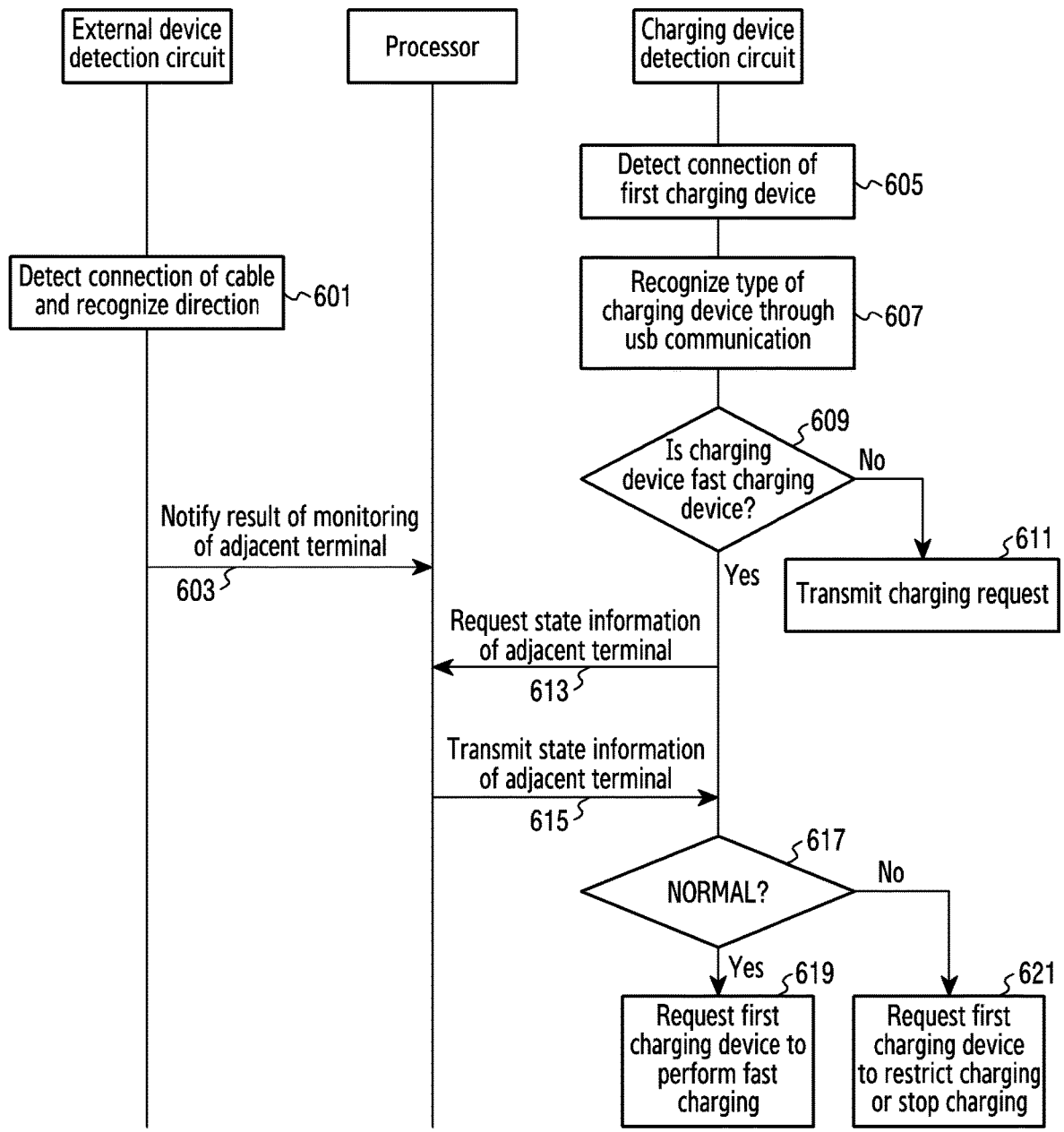
FIG. 6 is a flowchart illustrating a charging control procedure of an electronic device when a first charging device is connected according to an embodiment of the disclosure.

FIG. 6 is a flowchart illustrating a charging control procedure of an electronic device when a first charging device is connected according to an embodiment of the disclosure.

Referring to FIG. 6, in operation 601, an external device detection circuit (for example, the external device detection circuit 310) of the electronic device (for example, the electronic device 101, the electronic device 201, the electronic device 301) according to an embodiment of the disclosure may detect a connection of a cable (for example, the first cable 11, the second cable 13 to which the gender 14 is coupled) connected to a first charging device (for example, the first charging device 35), and may recognize a direction of the connected cable. The connection and direction of the cable may be recognized according to the USB-Type C standard, and a detailed description thereof is omitted. The external device detection circuit may notify a processor (for example, the processor 120, the processor 320) that the first charging device (or cable) is connected, although it is not illustrated. For example, the external device detection circuit may transmit, to the processor, attach information indicating that the first charging device (or cable) is connected.

In operation 603, the external device detection circuit according to an embodiment of the disclosure may monitor a state of at least one adjacent terminal, and may transmit a result of monitoring to the processor. The at least one adjacent terminal may include CC terminals CC1, CC2, reservation terminals SBU1, SBU2, data terminals TX1-, RX1-, TX2-, RX2-, as terminals positioned next to a power terminal VBUS. According to a certain embodiment, operation 603 may be performed upon request from the processor.

In operation 605, a charging device detection circuit (for example, the charging device detection circuit 388b) according to an embodiment of the disclosure may detect the connection of the first charging device. For example, when power of a set value (for example, 5 V) is inputted through the power terminal VBUS, the charging device detection circuit may recognize that the first charging device is connected.

In operation 607, the charging device detection circuit according to an embodiment of the disclosure may recognize a type of the first charging device through USB communication.

In operation 609, the charging device detection circuit according to an embodiment of the disclosure may identify whether the first charging device supports fast charging. As a result of identifying in operation 609, when the first charging device does not support fast charging, the charging device detection circuit may request the first charging device to charge (for example, charging of 5V) in a normal mode in operation 611.

On the other hand, when the first charging device supports fast charging as a result of identifying in operation 609, the charging device detection circuit may request information regarding a state of at least one adjacent terminal from the processor in operation 613. In operation 615, the processor according to an embodiment of the disclosure may transmit the requested state information of the at least one adjacent terminal to the charging device detection circuit.

In operation 617, the charging device detection circuit according to an embodiment of the disclosure may identify whether the at least one adjacent terminal is in a normal state. For example, the charging device detection circuit may identify whether the at least one adjacent terminal is short-circuited due to various factors (foreign substances, corrosion of a terminal or a manufacturing defect, a poor gender, etc.). Herein, the method for determining whether the at least one adjacent terminal is short-circuited has been described above with reference to FIGS. 4 and 5, and a detailed description thereof is omitted.

When all of the adjacent terminals are in the normal state as a result of identifying in operation 617, the charging device detection circuit may transmit a fast charging request to the first charging device in operation 619. For example, the charging device detection circuit may request the first charging device to provide a charging voltage of 9 V through USB communication.

On the other hand, when at least one adjacent terminal is in an abnormal state as a result of identifying in operation 617, the charging device detection circuit may restrict charging or may stop charging in operation 621. For example, the charging device detection circuit may control the first charging device to perform normal charging rather than fast charging. Alternatively, the charging device detection circuit may stop charging the battery. Alternatively, the charging device detection circuit may periodically reset charging.

According to a certain embodiment, operations 603, 613 and 615 may be omitted. For example, when attach information of the first CC terminal CC1 and the second CC terminal CC2 is received from the processor, the charging device detection circuit may determine that the first CC terminal CC1 and the second CC terminal CC2 are in the normal state (for example, a non-short circuit state) and may perform operation 619. On the other hand, when attach information of the first CC terminal CC1 and the second CC terminal CC2 is not received from the processor, the charging device detection circuit may determine that the first CC terminal CC1 and the second CC terminal CC2 are in the abnormal state (for example, the short-circuit state), and may perform operation 621. Similarly, in various embodiments, when only attach information of one of the first CC terminal CC1 or the second CC terminal CC2 is received from the processor, the charging device detection circuit may determine that one of the second CC terminal CC2 or the first CC terminal CC2 is in the abnormal state, and may perform operation 621.

According to various embodiments, at least some of operations 605, 607, 609, 611, 617 may be performed in the processor 320 (for example, the charging device detection circuit driver). For example, the charging device detection circuit may perform operation 605, and the processor may perform operation 607 of recognizing and operations 609, 617 of determining. The processor may perform operations 611, 619, and 621 through the charging device detection circuit. In this case, operations 613 and 615 may be omitted.

In various embodiments of the disclosure described above, when at least one adjacent terminal is short-circuited, the electronic device may restrict charging not to perform fast charging through the first charging device, or may stop charging, such that a problem that a high voltage is applied to the at least one adjacent terminal and/or components connected to the at least one adjacent terminal, and causes a damage can be solved.

Figure 7:
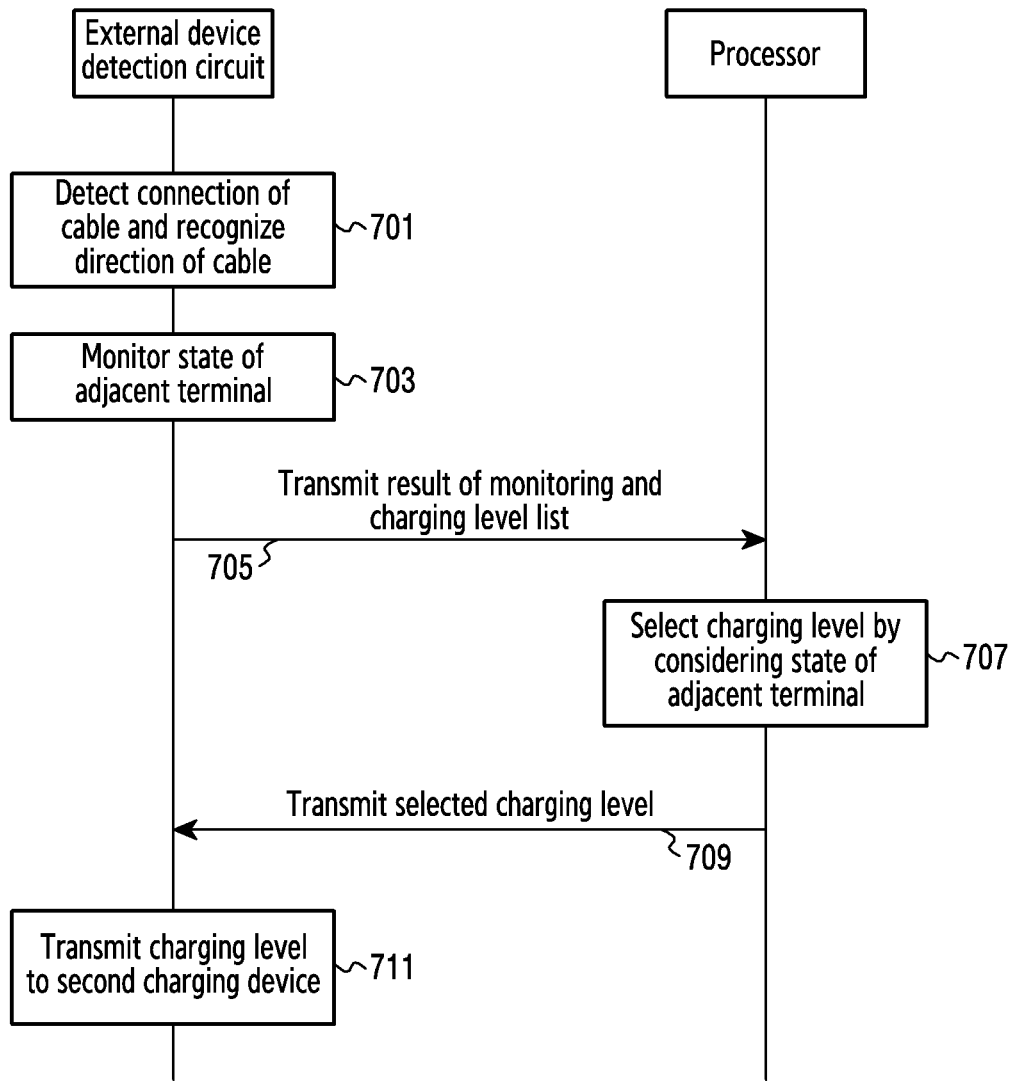
FIG. 7 is a flowchart illustrating a charging control procedure of an electronic device when a second charging device is connected according to another embodiment of the disclosure.

FIG. 7 is a flowchart illustrating a charging control procedure of an electronic device when a second charging device is connected according to another embodiment of the disclosure.

Referring to FIG. 7, in operation 701, an external device detection circuit (for example, the external device detection circuit 310) of the electronic device (for example, the electronic device 101, the electronic device 201, the electronic device 301) according to an embodiment of the disclosure may detect a connection of a cable (for example, the third cable 15) connected to a second charging device (for example, the monitor 31, the notebook 33, the second charging device 37), and may recognize a direction of the cable. The detection of the connection of the cable and the direction of the cable may conform to the USB Type-C standard, and a detailed description thereof is omitted. The external device detection circuit may notify a processor (for example, the processor 120, the processor 320) that the second charging device (or cable) is connected although it is not illustrated. For example, the external device detection circuit may transmit, to the processor, attach information indicating that the first charging device (or cable) is connected.

In operation 703, the external device detection circuit according to an embodiment of the disclosure may monitor a state of at least one adjacent terminal. For example, the external device detection circuit may identify whether at least one adjacent terminal is short-circuited.

In operation 705, the external device detection circuit according to an embodiment of the disclosure may transmit a result of monitoring and a charging level list to the processor (for example, the processor 120, the processor 320). The charging level list may include a plurality of charging voltages/currents that the second charging device can provide. For example, the charging level list may include charging levels such as 5 V/0.5 A, 5 V/1.5 A, 12 V/3 A, 20 V/5 A.

In operation 707, the processor according to an embodiment of the disclosure may select a charging level based on the state of the at least one adjacent terminal. For example, when none of the adjacent terminals is short-circuited, the processor may select a charging level for fast charging (for example, 12 V/3 A or 20 V/5 A). On the other hand, when at least one adjacent terminal is short-circuited, the processor may select a normal charging level (5 V/0.5 A or 5 V/1.5 A).

In operation 709, the processor according to an embodiment of the disclosure may transmit the selected charging level to the external device detection circuit.

In operation 711, the external device detection circuit according to an embodiment of the disclosure may request the second charging device to provide power corresponding to the selected charging level. For example, the external device detection circuit may request the second charging device to provide power corresponding to the selected charging level through PD communication.

In various embodiments of the disclosure described above, when at least one adjacent terminal is short-circuited, the electronic device may restrict charging not to perform fast charging through the second charging device (PD charging device), or may stop charging, such that a problem that a high voltage is applied to the at least one adjacent terminal and/or components connected to the at least one adjacent terminal, and causes a damage can be solved.

Figure 8:
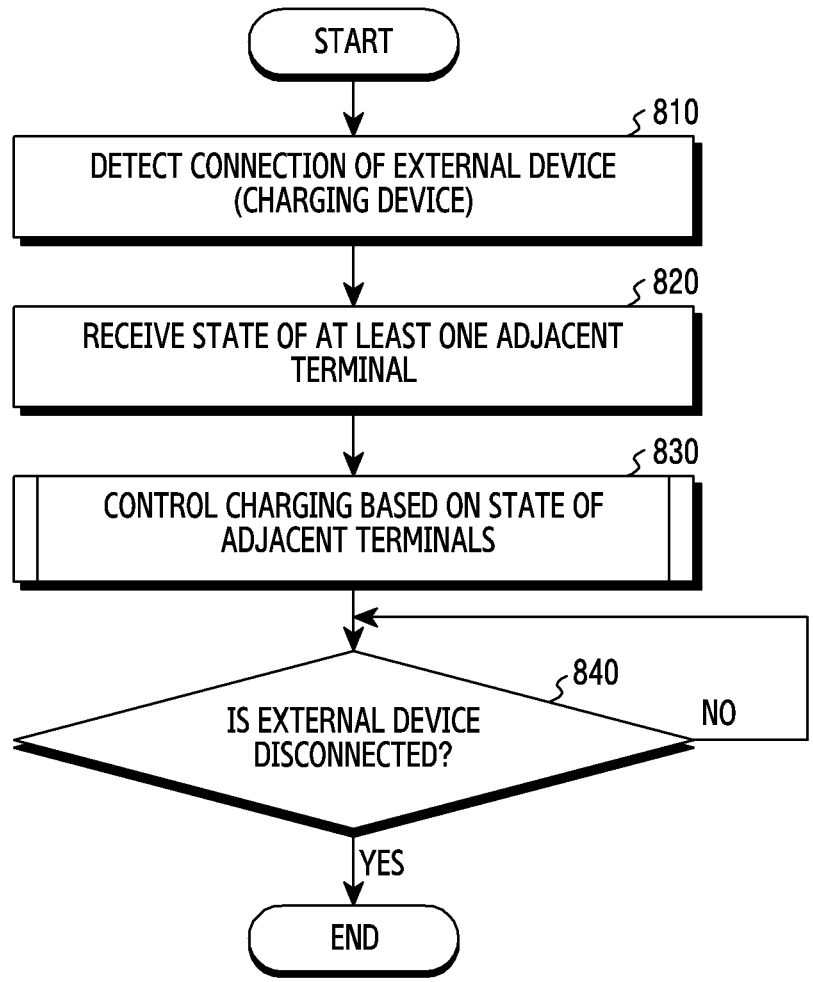
FIG. 8 is a sequence diagram to explain a method for controlling charging of an electronic device according to an embodiment of the disclosure.

FIG. 8 is a sequence diagram illustrating a charging control method of an electronic device according to an embodiment of the disclosure.

Referring to FIG. 8, in operation 810, a processor (for example, the processor 120, the processor 320) of the electronic device (for example, the electronic device 101, the electronic device 201, the electronic device 301) according to various embodiments of the disclosure may detect a connection of an external device (for example, a charging device). For example, the processor may be notified of the connection of the external device by an external device detection circuit (for example, the external device detection circuit 310). According to a certain embodiment, the processor may detect the connection of the external device through a charging device detection circuit (for example, the charging device detection circuit 388b). The external device may be a charging device which supports fast charging of an AFC, QC, or PD charging method.

In operation 820, the processor according to various embodiments of the disclosure may receive a state of at least one adjacent terminal. For example, the processor may receive information on whether at least one adjacent terminal is short-circuited from an external device detection circuit (for example, the monitoring circuit 311).

In operation 830, the processor according to various embodiments of the disclosure may control charging power based on the state of the at least one adjacent terminal. For example, the processor may restrict fast charging, may perform only normal charging, or may stop charging. The charging power control method will be described below with reference to FIG. 9.

In operation 840, the processor according to various embodiments of the disclosure may determine whether the external device is disconnected.

When the external device is not disconnected in operation 840, the processor may continue operation 840. On the other hand, when the external device is disconnected in operation 840, the processor may finish the charging control operation.

Figure 9:
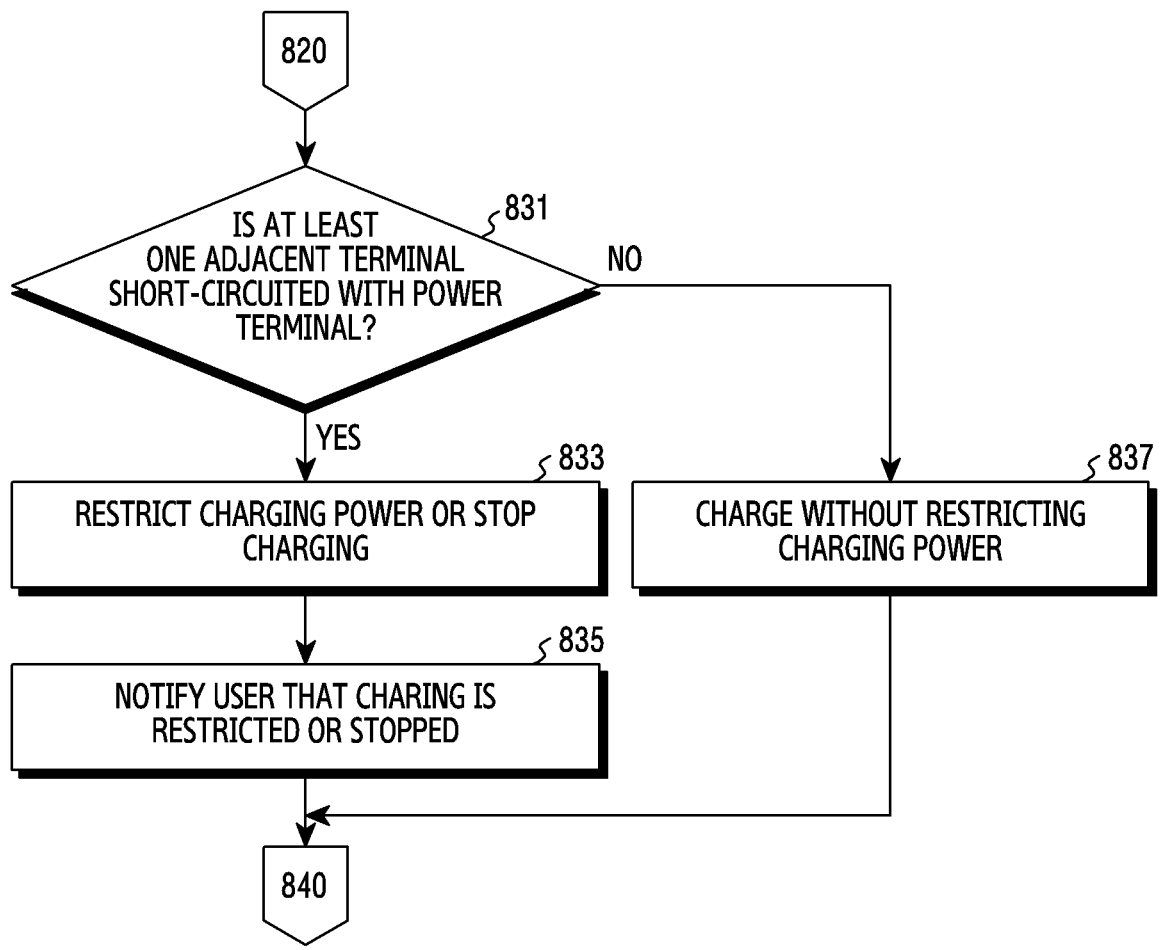
FIG. 9 is a sequence diagram to explain an operation of controlling a charging power of an electronic device in detail according to an embodiment of the present disclosure.

FIG. 9 is a sequence diagram to explain a charging power control operation of an electronic device in detail according to an embodiment of the disclosure.

Referring to FIG. 9, in operation 831, a processor (for example, the processor 120, the processor 320) of the electronic device (for example, the electronic device 101, the electronic device 201, the electronic device 301) according to various embodiments of the disclosure may identify whether at least one adjacent terminal is short-circuited with a power terminal.

When the at least one adjacent terminal is short-circuited with the power terminal as a result of identifying in operation 831, the processor may restrict charging power or may stop charging in operation 833. For example, the processor may restrict charging not to perform fast charging.

In operation 835, the processor according to various embodiments of the disclosure may notify a user that charging is restricted or stopped. For example, the processor may output a pop-up message, may output a sound effect, or may display an icon on one side. In various embodiments of the disclosure, the user may be induced to check the electronic device, the charging device, or the cable.

When none of the adjacent terminals is short-circuited with the power terminal as a result of identifying in operation 831, the processor may perform charging without restricting charging power in operation 837. For example, the processor may control the charging device to supply charging power for fast charging.

Figure 10:
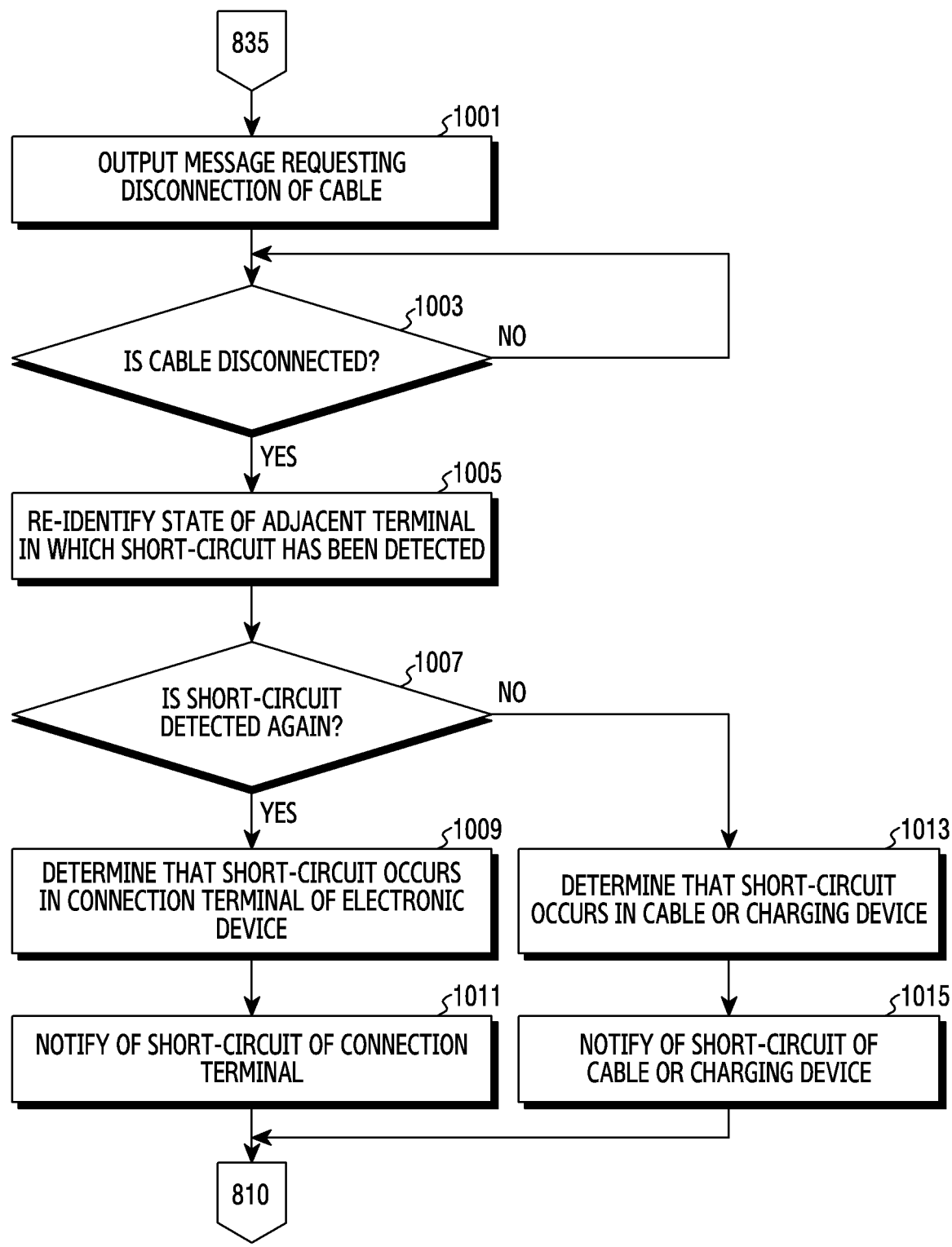
FIG. 10 is a sequence diagram to explain a method for determining a component in which a short-circuit occurs in an electronic device according to an embodiment of the disclosure.

FIG. 10 is a sequence diagram to explain a method for determining a component of an electronic device in which a short-circuit occurs according to an embodiment of the present disclosure.

Referring to FIG. 10, in operation 1001, a processor (for example, the processor 120, the processor 320) of the electronic device (for example, the electronic device 101, the electronic device 201, the electronic device 301) according to various embodiments of the disclosure may output a message requesting disconnection of a cable. For example, when a short-circuit of at least one adjacent terminal is detected and charging is restricted, the processor may display a message requesting disconnection of the cable (for example, "Remove the cable from the electronic device.") on one side of a screen.

In operation 1003, the processor according to an embodiment of the disclosure may identify whether the cable is disconnected. For example, the processor may receive information indicating that the cable is disconnected from an external device detection circuit.

When the cable is not disconnected as a result of identifying in operation 1003, the processor according to an embodiment of the disclosure may continue operation 1003. According to a certain embodiment, when a designated time is elapsed, the processor may remove the output of the message and may return to operation 835 described above.

On the other hand, when the cable is disconnected as a result of identifying in operation 1003, the processor according to an embodiment of the disclosure may re-identify a state of the adjacent terminal in which the short-circuit has been detected in operation 1005. For example, the processor may supply power to a power terminal of a connection terminal (for example, the connection terminal 378) without the cable connected, and may re-identify the state of the adjacent terminal in which the short-circuit has been detected. The processor may drive an on-to-go (OTG) mode and may supply power to the power terminal of the connection terminal.

In operation 1007, the processor according to an embodiment of the disclosure may identify whether a short-circuit of the adjacent terminal is detected again.

When the short-circuit is detected again as a result of identifying in operation 1007, the processor may determine that the short-circuit occurs in the connection terminal (for example, the connection terminal 178, the connection terminal 378) of the electronic device in operation 1009. In operation 1011, the processor according to an embodiment of the disclosure may notify of a damage of the connection terminal of the electronic device. For example, the processor may display a message requesting repair of the connection terminal on one side of the screen.

On the other hand, when the short-circuit is not detected again as a result of identifying in operation 1007, the processor may determine that the short-circuit occurs in the cable (or gender) or a charging device in operation 1013. In operation 1015, the processor according to an embodiment of the disclosure may notify of a damage of the cable (or gender) or the charging device. For example, the processor may display a message requesting replacement of the cable or charging device on one side of the screen.

According to a certain embodiment, in operation 1013, the processor may request only a connection of the cable (or gender), and may identify whether a short-circuit occurs again. When a short-circuit is detected again, the processor may determine that the short-circuit occurs in the cable (or gender), and, when a short-circuit is not detected again, the processor may determine that the short-circuit occurs in the charging device.

In an embodiment of the disclosure described above, the user can easily recognize a device or a component in which a short-circuit occurs, such that convenience can be enhanced.

A charging control method of an electronic device according to various embodiments of the disclosure may include: detecting a connection of a charging device to a connection terminal which wiredly communicates with an external electronic device; identifying a state of at least one adjacent terminal positioned next to a power terminal of the connection terminal; and controlling a charging power of the charging device, based on the state of the adjacent terminals.

According to various embodiments, identifying the state of the adjacent terminals may include identifying whether at least one of the adjacent terminals is short-circuited with the power terminal.

According to various embodiments, the method may further include identifying whether the charging device supports fast charging of charging a battery with a voltage exceeding a designated voltage, and identifying the state of the at least one adjacent terminal may be performed when the charging device supports the fast charging.

According to various embodiments, controlling the charging power of the charging device may include one of: in response to the short-circuit being detected, maintaining a charging voltage of the charging device at the designated voltage or lower; stopping charging through the charging device; or transmitting a reset command to the charging device periodically.

According to various embodiments, the method may further include notifying that the charging power is restricted or stopped due to a short-circuit of at least one of the adjacent terminals.

According to various embodiments, the method may further include: when the short-circuit is detected, notifying a user of disconnection of the charging device; after the charging device is disconnected, identifying whether the at least one adjacent terminal is short-circuited again; and when a short-circuit is detected again as a result of identifying again, determining that the short-circuit occurs in the connection terminal of the electronic device.

According to various embodiments, the method may further include, when the short-circuit is not detected again, determining that the short-circuit occurs in at least one of the charging device, a cable, or a gender.

According to various embodiments, the method may further include notifying the user of occurrence of the short-circuit in the connection terminal of the electronic device, or notifying the user of occurrence of the short-circuit in at least one of the charging device, the cable, or the gender.

According to various embodiments, the connection terminal may have a USB Type-C standard, and the at least one adjacent terminal may include at least one of a channel configuration terminal, a reservation terminal, a negative transmission terminal, or a negative reception terminal.

According to various embodiments of the disclosure, a computer-readable recording medium may store at least one instructions that, when being executed by at least one processor, cause the at least one processor to detect a connection of a charging device to a connection terminal which wiredly communicates with an external electronic device; to identify a state of at least one adjacent terminal positioned next to a power terminal of the connection terminal; and to control a charging power of the charging device, based on the state of the adjacent terminals.

The electronic device according to various embodiments may be one of various types of electronic devices. The electronic devices may include, for example, at least one of a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, and/or replacements for a corresponding embodiment. With regard to the description of the drawings, similar reference numerals may be used to refer to similar elements. It is to be understood that a singular form of a noun may include one or more of the things, unless the relevant context clearly indicates otherwise. As used herein, each of such phrases as "A or B," "at least one of A and/or B," "A, B, or C," or "at least one of A, B, and/or C," may include all possible combinations of the items enumerated together. As used herein, such terms as "1st," "2nd," "first" or "second" may modify corresponding components regardless of an importance or an order, be used to distinguish a component from another, and does not limit the corresponding components. It is to be understood that if an element (e.g., a first element) is referred to, "(operatively or communicatively) connected with," or "connected to" another element (e.g., a second element), it means that the element may be coupled with the other element directly, or via other element (e.g., a third element).

As used herein, the term "module" includes a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, the module may be implemented in a form of an application-specific integrated circuit (ASIC).

Various embodiments as set forth herein may be implemented as software (e.g., the program 140) including instructions that are stored in a machine readable storage medium (e.g., internal memory 136 or external memory 138) that is readable by a machine (e.g., computer). The machine may invoke instructions stored in the storage medium, be operated to perform functions according to the instructions invoked, and include the electronic device (e.g., the electronic device 101, the electronic device 201, the electronic device 301) according to embodiments disclosed. If the instructions are executed by a processor (e.g., the processor 120, the processor 320), the processor may execute functions corresponding to the instructions directly or using other components under the control of the processor. The instructions may include a code generated or executed by a compiler or an interpreter. The machine-readable storage medium may be provided in the form of a non-transitory storage medium. Wherein, the term "non-transitory" simply means that the storage medium does not include a signal and is tangible, but does not differentiate between semi-permanently storing the data in the storage medium and temporarily storing the data in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed online via an application store (e.g., Play Store™). If distributed online, at least part of the computer program product may be temporarily generated or at least temporarily stored in the storage medium, such as memory of the manufacturer's server, a server of the application store, or a relay server.

According to various embodiments, each component (e.g., a module or a program) may include a single entity or multiple entities, and part of the above-described components may be omitted, or other components may be added. Alternatively or additionally, the part of components (e.g., modules or programs) may be integrated into a single component, and may still perform a function of each component in the same or similar manner as they are performed by each component before the integration. According to various embodiments, operations performed by the module, the program, or another component may be carried out sequentially, in parallel, repeatedly, or heuristically, or at least part operation may be executed in a different order or omitted, or other operations may be added.

What is claimed is:

1. An electronic device comprising:
a connection terminal configured to wiredly communicate with an external electronic device; and
at least one processor functionally connected with the connection terminal, wherein the at least one processor is configured to:
detect a connection of a charging device through the connection terminal;
receive state information of at least one adjacent terminal positioned next to a power terminal of the connection terminal, the state information indicates whether the at least one adjacent terminal is short-circuited with the power terminal;
in response to the state information indicating the short-circuit, transmit, to the charging device, a request for controlling a charging power of the charging device to be supplied from the charging device to the electronic device, the request causing a charging voltage of the charging power to be maintained at a designated voltage or lower, causing a charging by the charging device to stop, or transmitting a reset command to the charging device periodically;
in response to the state information indicating the short-circuit, notify a user that the charging power is restricted or stopped due to the short-circuit, and notify the user that a disconnection of the charging device;
after the charging device is disconnected, identify whether the at least one adjacent terminal is short-circuited again; and
in response to a result of the identification indicating the short-circuit again, determine that the short-circuit occurs in the connection terminal of the electronic device, and notify the user that the short-circuit has occurred in the connection terminal.

2. The electronic device of claim 1, wherein, when the charging device supports fast charging of charging a battery with a voltage exceeding the designated voltage, the at least one processor is configured to identify the state information of the at least one adjacent terminal.

3. The electronic device of claim 1, wherein the connection terminal has a USB Type-C standard, and the at least one adjacent terminal comprises at least one of a channel configuration terminal, a reservation terminal, a negative transmission terminal, or a negative reception terminal.

4. The electronic device of claim 3, wherein the at least one processor is configured to:
determine whether the channel configuration terminal of the connection terminal is short-circuited by comparing a voltage of the channel configuration terminal and a reference voltage.

5. The electronic device of claim 3, wherein the at least one processor is configured to:
apply a high signal and a low signal to the reservation terminal of the connection terminal alternately, and
determine whether the reservation terminal is short-circuited by checking an output signal of the reservation terminal.

6. The electronic device of claim 1, wherein the at least one processor is configured to:
in response to the result of the identification does not indicating the short-circuit again, determine that the short-circuit occurs in at least one of the charging device, a cable, or a gender, and
notify the user that the short-circuit has occurred in at least one of the charging device, the cable, or the gender.

7. A charging control method of an electronic device, the method comprising:
detecting a connection of a charging device to a connection terminal which wiredly communicates with an external electronic device;
identifying state information of at least one adjacent terminal positioned next to a power terminal of the connection terminal, the state information indicates whether the at least one adjacent terminal is short-circuited with the power terminal;
in response to the state information indicating the short-circuit, transmitting, to the charging device, a request for controlling a charging power of the charging device to be supplied from the charging device to the electronic device, the request causing a charging voltage of the charging power to be maintained at a designated voltage or lower, causing a charging by the charging device to stop, or transmitting a reset command to the charging device periodically;
in response to the state information indicating the short-circuit, notifying a user that the charging power is restricted or stopped due to the short-circuit, and notifying the user that a disconnection of the charging device;
after the charging device is disconnected, identifying whether the at least one adjacent terminal is short-circuited again; and
in response to a result of the identification indicating the short-circuit again, determining that the short-circuit occurs in the connection terminal of the electronic device, and notifying the user that the short-circuit has occurred in the connection terminal.

8. The method of claim 7, further comprising identifying whether the charging device supports fast charging of charging a battery with a voltage exceeding the designated voltage,
wherein identifying the state of the at least one adjacent terminal is performed when the charging device supports the fast charging.

9. The method of claim 7, wherein the connection terminal has a USB Type-C standard, and the at least one adjacent terminal comprises at least one of a channel configuration terminal, a reservation terminal, a negative transmission terminal, or a negative reception terminal.

10. The method of claim 7, further comprising:
in response to the result of the identification does not indicating the short-circuit again, determining that the short-circuit occurs in at least one of the charging device, a cable, or a gender.

11. The method of claim 10, further comprising:
notifying the user that the short-circuit has occurred in at least one of the charging device, the cable, or the gender.

12. A non-transitory computer-readable recording medium storing at least one instructions, the at least one instructions, when being executed by at least one processor, cause the at least one processor to:
detect a connection of a charging device to a connection terminal which wiredly communicates with an external electronic device;
identify state information of at least one adjacent terminal positioned next to a power terminal of the connection terminal, the state information indicates whether the at least one adjacent terminal is short-circuited with the power terminal;
in response to the state information indicating the short-circuit, transmit, to the charging device, a request for controlling a charging power of the charging device to be supplied from the charging device, the request comprises causing a charging voltage of the charging power to be maintained at a designated voltage or lower, causing a charging by the charging device to stop, or transmitting a reset command to the charging device periodically;
in response to the state information indicating the short-circuit, notify a user that the charging power is restricted or stopped due to the short-circuit, and notify the user that a disconnection of the charging device;
after the charging device is disconnected, identify whether the at least one adjacent terminal is short-circuited again; and
in response to a result of the identification indicating the short-circuit again, determine that the short-circuit occurs in the connection terminal, and notify the user that the short-circuit has occurred in the connection terminal.

* * * * *